(12) United States Patent
Law et al.

(10) Patent No.: US 6,338,874 B1
(45) Date of Patent: *Jan. 15, 2002

(54) METHOD FOR MULTILAYER CVD PROCESSING IN A SINGLE CHAMBER

(75) Inventors: Kam S. Law, Union City; Robert Robertson, Palo Alto; Pamela Lou, San Francisco; Marc Michael Kollrack, Alameda; Angela Lee, Sunnyvale; Dan Maydan, Los Altos Hills, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/572,385

(22) Filed: Dec. 14, 1995

Related U.S. Application Data

(63) Continuation of application No. 08/273,290, filed on Jul. 11, 1994, now abandoned, which is a continuation of application No. 08/010,110, filed on Jan. 28, 1993, now abandoned.

(51) Int. Cl.[7] .............................................. C23C 16/00
(52) U.S. Cl. ........................... 427/255.18; 427/255.19; 427/255.27; 427/255.37; 427/255.394
(58) Field of Search .......... 437/40, 41; 427/255–255.7, 427/574, 578, 579, 58, 255.18, 255.19, 255.27, 255.37, 255.394

(56) References Cited

U.S. PATENT DOCUMENTS

| | | | |
|---|---|---|---|
| 4,692,344 A | * | 9/1987 | Kaganowicz et al. ........ 427/579 |
| 4,735,822 A | * | 4/1988 | Ohtoshi et al. .......... 427/255.1 |
| 4,772,570 A | * | 9/1988 | Kanai et al. ................. 427/574 |
| 4,842,897 A | * | 6/1989 | Takeuchi et al. .......... 427/255.2 |
| 4,892,753 A |   | 1/1990 | Wang et al. .................... 427/38 |
| 4,897,284 A | * | 1/1990 | Arai et al. .................... 427/578 |
| 4,951,601 A |   | 8/1990 | Maydan et al. .............. 118/719 |
| 4,984,041 A | * | 1/1991 | Hack et al. ................. 357/23.7 |

(List continued on next page.)

FOREIGN PATENT DOCUMENTS

| | | | |
|---|---|---|---|
| EP | 272140 | 6/1988 | ........... C23C/16/54 |
| EP | 272141 | 6/1988 | ........... H01L/21/00 |
| EP | 419160 | 3/1991 | ......... H01L/29/784 |
| EP | 476701 | 3/1992 | ......... H01L/29/784 |

(List continued on next page.)

OTHER PUBLICATIONS

"Reactive Ion Etching of PECVD n⁺α–Si:H", Kuo et al, J. Electrochem. Soc. 139 (1992) Feb., No. 2, pp. 548–552.

A Self–Alignment Process for Amorphous Silicon Thin Film Transistors, IEEE Electron Device LEtters, vol. EDL–3, No. 7, Jul. 1982, pp. 187–189.

(List continued on next page.)

Primary Examiner—Brian K Talbot
(74) Attorney, Agent, or Firm—Birgit E. Morris

(57) ABSTRACT

Multilayer deposition of thin films onto glass substrates to form thin film transistors can be carried out in the same chamber under similar reaction conditions at high deposition rates. We have found that sequential thin layers of silicon nitride and amorphous silicon can be deposited in the same chamber by chemical vapor deposition using pressure of at least 0.5 Torr and substrate temperatures of about 250–370° C. Subsequently deposited different thin films can also be deposited in separate chemical vapor deposition chambers which are part of a single multichamber vacuum system.

24 Claims, 2 Drawing Sheets

U.S. PATENT DOCUMENTS

| | | | | |
|---|---|---|---|---|
| 5,041,888 A | * | 8/1991 | Possin et al. | 357/23.7 |
| 5,060,034 A | * | 10/1991 | Shimizu et al. | 427/579 |
| 5,075,244 A | | 12/1991 | Sakai et al. | 437/41 |
| 5,132,745 A | * | 7/1992 | Kwasnick et al. | 357/4 |

FOREIGN PATENT DOCUMENTS

| | | | | |
|---|---|---|---|---|
| EP | 573823 | | 12/1993 | H01L/21/205 |
| JP | 125082 | * | 11/1986 | |
| JP | 61-88518 | | 3/1987 | H01L/21/205 |
| JP | 299080 | * | 12/1987 | |
| JP | 315940 | * | 12/1988 | |
| JP | 31468 | * | 2/1989 | |
| JP | 2-186641 | | 1/1990 | H01L/21/336 |
| JP | 2-51277 | | 2/1990 | H01L/29/784 |
| JP | 4-346419 | | 4/1992 | H01L/21/205 |
| JP | 6-84888 | | 3/1994 | 21/316 |

OTHER PUBLICATIONS

"Photochemical Vapor Depostion of Silicon Nitride and fabrication of Thin–Film Transistor", Suzuki et al, Electronics and Communications in Japan, Part 2, vol. 73, No. 8, no month available 1990, pp. 71–77.

EP Search dated Mar. 18, 1996.

Madan et al, The Physics and Applications of Amorphous Semiconductors, academic Press, no month available 1988, pp. 232–235, 240–243, 268–275, 290–297.

Joint Development Agreement Between Applied Materials, Inc. (Applicant's Assignee) and two unrelated companies (Companies A & B) dated May 29, 1991 (Exhibit A hereto).

* cited by examiner

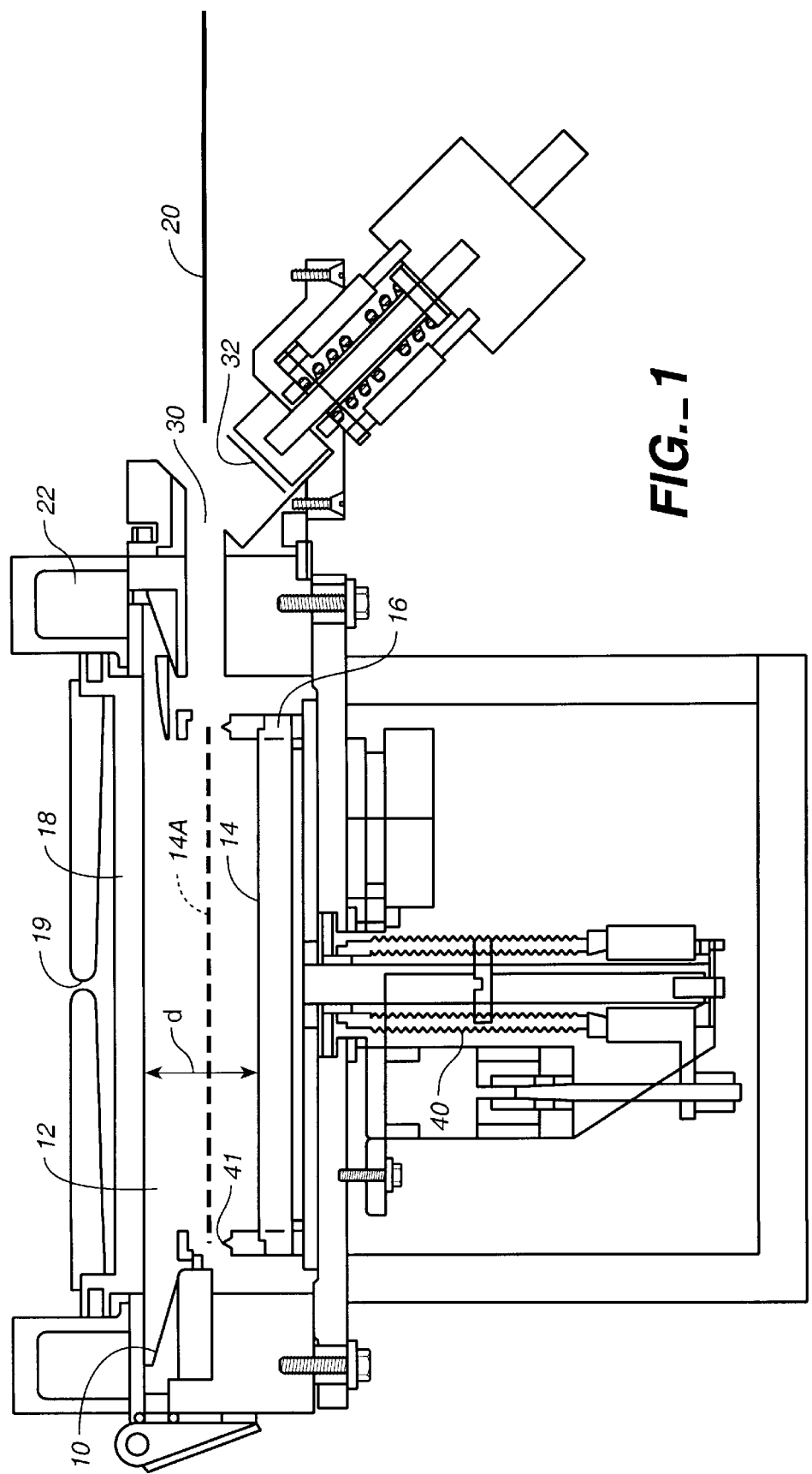
FIG._1

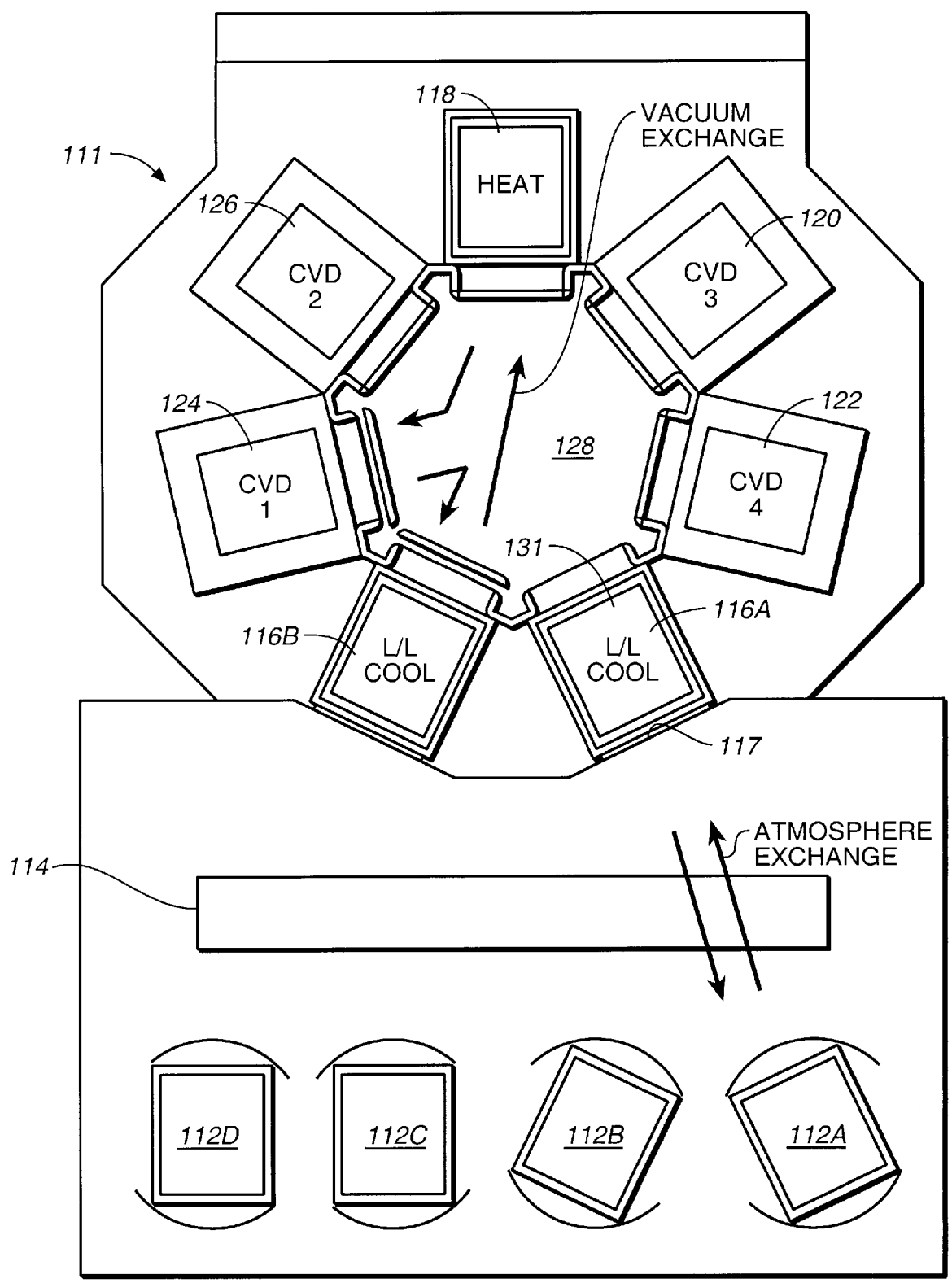
FIG._2

METHOD FOR MULTILAYER CVD PROCESSING IN A SINGLE CHAMBER

This is a continuation of U.S. application Ser. No. 08/273,290 filed Jul. 11 1994 now abandoned, which is a continuation of application ser. No.08/010,110 filed Jan. 28, 1993 now abandoned.

This invention relates to the deposition of multilayer thin films using chemical vapor deposition processing. More particularly, this invention relates to a process for depositing sequential layers of different thin films in the same processing chamber.

BACKGROUND OF THE INVENTION

In the manufacture of liquid crystal cells, two glass plates are joined together with a layer of a liquid crystal material sandwiched between them. The glass substrates have conductive films thereon (at least one must be transparent, such as an ITO film) that can be connected to a source of power to change the orientation of the liquid crystal material. Various areas of the liquid crystal cell can be accessed by proper patterning of the conductive films. More recently, thin film transistors have been used to separately address areas of the liquid crystal cell at fast rates. Such liquid crystal cells are useful for active matrix displays such as TV and computer monitors.

As the requirements for resolution of liquid crystal monitors has increased, it has become desirable to separately address a plurality of areas of the liquid crystal cell, called pixels. Since up to about 1,000,000 pixels are present in modern displays, at least the same number of transistors must be formed on the glass plates so that each pixel can be separately addressed.

Different types of thin film transistors are in current use but most require deposition of a gate dielectric layer over a patterned gate metal with an amorphous silicon layer thereover. Metal contacts are deposited thereafter over the amorphous silicon film, which also can have a thin layer of doped silicon thereover to improve contact between the amorphous silicon and the overlying metal contacts. A nitride layer can also be deposited over the amorphous silicon layer as an etch stop.

It is known how to deposit amorphous silicon and silicon nitride layers by glow discharge or a plasma type process. However, the rate of deposition of CVD films is quite low, e.g., about 100–300 angstroms per minute. Since films up to about 5000 angstroms thick are required for the manufacture of thin film transistors, comparatively lengthy deposition times are thus required which increases the cost of making these films. It would be desirable to improve the deposition rate of CVD films to reduce costs.

Because of the large size and weight of glass substrates which are for example about 350×450×1.1 mm in size, generally large reaction chambers are required for deposition of thin films thereon, and large and often slow transfer equipment is needed to transfer the substrates from one reaction chamber to another for sequential deposition of these thin films. The transfer of substrates requires some amount of time and reduces the throughput of the system. Further the transfer is generally accompanied by a drop in substrate temperature; thus the substrate has to be reheated up to deposition temperature after such transfer, again adding to the time required for deposition. In addition, the danger of contamination of the deposited film during transfer from one chamber to another is always present.

Thus it would be highly desirable to be able to deposit more than one film sequentially in the same reaction chamber in an efficient way, thus eliminating one or more transfer steps, with the disadvantages enumerated above, but without sacrificing the quality of the films or their deposition rate.

SUMMARY OF THE INVENTION

We have found that a plurality of consecutive films useful for making thin film transistors can be sequentially deposited in the same reaction chamber under certain conditions of temperature and pressure. This process eliminates one or more transfers of the large glass substrates between reaction chambers. For one type of transistor it is possible to deposit the gate dielectric silicon nitride and the active amorphous silicon films in the same chamber. For another type of transistor it is possible to deposit the gate dielectric silicon nitride, the active amorphous silicon and a second silicon nitride in the same chamber. For other transistor designs other combinations of films may be needed, and these films may also be deposited in the same chamber. Further, we have found that the deposition rates are improved over prior art processes, thus doubly improving the efficiency of the present process.

BRIEF DESCRIPTION OF THE DRAWING

FIG. 1 is a cross sectional view of a CVD reactor useful for deposition of sequential thin films on large glass substrates.

FIG. 2 is a plan view of a vacuum system for processing glass substrates including the CVD reactor of FIG. 1.

DETAILED DESCRIPTION OF THE INVENTION

Details of deposition of certain thin films are described in copending applications of Law et al, "METHOD FOR DEPOSITING SILICON NITRIDE THIN FILMS ONTO LARGE AREA GLASS SUBSTRATES BY CHEMICAL VAPOR DEPOSITION AT HIGH DEPOSITION RATES" (Ser. No. 08/010,118 filed Jan. 28, 1993) and "METHOD FOR DEPOSITING AMORPHOUS SILICON THIN FILMS ONTO LARGE AREA GLASS SUBSTRATES BY CHEMICAL VAPOR DEPOSITION AT HIGH DEPOSITION RATES" (Ser. No. 08/010,118 filed Jan. 28, 1993) filed concurrently herewith.

We have found that we can deposit sequential films in the same chamber over large glass substrates having preformed gate metal areas deposited thereon. The entire process of forming transistors on large glass substrates comprises many steps, including the deposition steps described in the above referenced copending applications. These deposition processes have high deposition rates. The other steps involve the stabilization or transition of conditions in the chamber. The steps between sequential depositions are important for the interface between the sequential layers. Because the steps performed between depositions are all carried out within the same vacuum chamber, this process leads to improved control of the interface properties obtained using prior art deposition systems.

U.S. Pat. No. 4,892,753 to Wang et al, incorporated herein by reference, describes a plasma enhanced CVD reactor having features suitable for carrying out the present CVD processes. Although the reactor of this reference is described in terms of processing semiconductor wafers, suitable adjustments of size will accommodate the present large glass substrates.

The reactor useful herein will be further described with reference to FIG. 1.

FIG. 1 is a cross sectional view of a vacuum chamber 10, typically made of aluminum, that has a reaction region 12. A substrate 14 is supported on a suitable support or susceptor 16 that can be heated, as by a resistive heater embedded in the susceptor 16. Above the substrate 14 is a gas manifold plate 18 which supplies the precursor reaction gases, carrier gases and purge gases from a gas inlet 19 to the reaction region 12. The spacing -d- between the substrate 14 and the gas manifold plate 18 is adjustable. Because this spacing can be adjusted, along with the other adjustable process conditions of pressure, power, gas flows and temperature, it is possible to achieve certain film properties and film property uniformity across the large area of the substrates while achieving high deposition rates. The spacing between the substrate 14 and the gas manifold plate 18 in a chamber such as is disclosed in Wang et al is typically about one inch. An elevator assembly 40 allows the substrate support 16 to be raised and lowered with respect to the gas manifold plate 18.

The elevator assembly 40 has a dual function. When a substrate 14 is transferred into the vacuum chamber 10 by means of a substrate support arm 20 operated by a robot in an adjacent chamber (not shown), the position of the substrate 14 in the vacuum chamber initially is shown by the dotted line 14A. At that time the lift pins 41 are raised to support the substrate while the support arm 20 is retracted from the vacuum chamber. The elevator assembly 40 then raises the susceptor 16 and the substrate 14 to its processing position. A closable opening 30 is opened to allow entry and exit of the substrate 14 by the robot support arm 20. During processing, the closable opening 30 is closed by means of a piston driven slit valve 32.

The gas manifold plate 18 is a plate having a plurality of openings therethrough uniformly distributed over the gas manifold plate 18. A typical gas manifold plate 18 useful herein has about 10,000 openings in the plate which is about the same size as the substrate 14.

The gas manifold plate 18 is part of a gas distribution system that flows the process gases across the substrate 14 and radially outwardly to the edges of the substrate and beyond, where they are removed by evacuation channel 22 connected to an exhaust port (not shown). A shield or shadow frame 24 prevents deposition onto the edges of the substrate 14.

The temperature of the gas manifold plate 18 is regulated so as to minimize deposition of the solid products of the reaction onto the gas manifold plate 18.

An RF power supply and matching network (not shown) create and sustain a plasma of the process gases from the precursor gases in the reaction region 12. Preferably high frequency RF power of 13.56 MHz is employed, but this is not critical and lower frequencies can be used. Further, the gas manifold plate 18 is RF driven, while the susceptor or substrate support 16 is grounded. Suitably the walls of the chamber are covered with a protective ceramic material. This design allows a high degree of plasma confinement between the gas manifold plate 18 and the substrate support 16, thereby increasing the concentration of reactive species and the deposition rate of the subject thin films.

By maintaining the spacing -d- between the gas manifold plate 18 and the substrate 14 relatively small, the vacuum chamber 10 itself can be made smaller and the deposition processes are more controllable; further, the small volume of the reaction region 12 allows rapid changes of gas components in the reaction region 12 and reactant gases and by-product gases from a first deposition can be rapidly removed and replaced for a subsequent one or more depositions.

Gate dielectric silicon nitride films must be of high quality to be useful in forming thin film transistors on glass substrates. In accordance with the process of the invention, such high quality silicon nitride films can be made at deposition rates of up to 2000–3000 angstroms/min, which was highly unexpected. These rates are achievable by maintaining the pressure in the CVD chamber at between about 0.8 to 2.0 Torr, and the temperature of the substrate at about 300–350° C. during deposition. In addition precursor gas flow rates are regulated to maintain adequate reaction gas levels. Suitably silane (100–300 sccm) and ammonia (500–1000 sccm) are employed in a carrier gas of nitrogen (1000–10,000 sccm) to deposit silicon nitride films.

In similar manner, amorphous silicon thin films are deposited over the gate dielectric silicon nitride film using silane as the precursor gas (100–1200 sccm) in a hydrogen carrier gas (1000–3000 sccm). Unexpectedly, we have found that amorphous silicon thin films can be deposited at rapid rates, uniformly over the silicon nitride layer, using the same temperature as for the silicon nitride films. Thus by merely changing the gases, power, spacing and pressure, sequential thin films of silicon nitride and amorphous silicon can be deposited onto large glass substrates in the same reaction chamber, and at high deposition rates. In general the thickness of amorphous silicon films for thin film transistor applications will vary from about 300–3000 angstroms.

The temperature of the glass plates must be high enough to form high quality films but must be maintained below about 450° C. when the large glass substrates may warp. In general a deposition temperature of from about 270–350° C. is maintained during deposition.

The present invention will be further illustrated in the following examples, but the invention is not to be limited to the details described therein.

EXAMPLE 1

Glass substrates 360×450×1.1 mm thick having a preselected pattern of gate metal pads deposited thereon in an array and having a layer of silicon oxide about 2500 angstroms thick thereover was brought under vacuum and into a CVD chamber. The substrate was then heated to 330° C. under flowing nitrogen and then sequential deposition of silicon nitride and amorphous silicon thin films carried out under the following conditions:

For Silicon Nitride Deposition $SiH_4$ 110 sccm $NH_3$ 550 sccm $N_2$ 3900 sccm

Power 600 Watts

Pressure 1.2 Torr

Spacing 1000 mils

Susceptor Temperature 397° C.

Substrate Temperature 340° C.

The rate of deposition was 930 angstroms/min and a layer about 500 angstroms thick was deposited (in about 32 seconds).

This layer had a refractive index of 1.91, a compressive stress of $-4.9 \times 10^9$ dynes/cm$^2$, a wet etch rate of 360 Angstroms/min in 6:1 buffered HF solution, and a root mean squared surface roughness of 1.1 nm, all of which are indicative that a good quality gate dielectric silicon nitride was deposited.

After a 30 second purge with nitrogen, a second layer, this time of amorphous silicon, was deposited over the silicon nitride layer using the same manifold-substrate spacing under the following conditions:

For Amorphous Silicon Deposition
  SiH$_4$ 275 sccm
  H$_2$ 1550 sccm
  Power 300 Watts
  Pressure 1.2 Torr
  Susceptor Temperature 397° C.
  Substrate Temperature 320° C.*

*Although the susceptor temperature and the pressure remained the same, the temperature of the substrate was slightly lower because hydrogen is a better heat transfer medium.

The amorphous silicon deposition rate was 944 angstroms/min and the film was deposited to a thickness of 3000 angstroms. The stress in this film was measured to be −6.9 ×10$^9$ dynes/cm$^2$. The SiH peak position was 2000 cm$^{-1}$ and the peak width was <120cm−$^1$.

The above films were formed into finished transistor devices and tested. The devices had satisfactory device characteristics, including threshold voltage, mobility and leakage current in the off mode, comparable to devices made on prior art deposition equipment.

Thus sequential deposition of high quality films of silicon nitride gate dielectric and amorphous silicon was carried out in the same chamber, at high deposition rates, and at the same susceptor temperature.

EXAMPLE 2

Silicon nitride and amorphous silicon films were deposited following the procedure of Example 1, except for the change in the silicon nitride deposition conditions:
  SiH$_4$ 110 sccm
  NH$_3$ 550 sccm
  Nitrogen 3700 sccm
  Power 600 Watts
  Pressure 0.8 Torr
  Spacing 1000 mils
  Susceptor Temperature 397° C.
  Substrate Temperature 330° C.*

*The reduction in the pressure resulted in a reduction in the substrate temperature due to the decrease in the efficiency of heat transfer from the susceptor to the substrate.

The silicon nitride film deposited under the above conditions was judged to be of good quality.

After a 30 second purge with nitrogen, a second layer of amorphous silicon was deposited under the same conditions as in Example 1 over the silicon nitride.

The electrical characteristics of transistors made with these films were good.

This example demonstrates that the substrate temperature can be varied using varying process conditions, in this case the pressure, while holding the susceptor at a constant temperature.

EXAMPLE 3

Silicon nitride and amorphous silicon were deposited following the procedure in Example 1 except that the susceptor temperature was changed from 358° C. for the silicon nitride deposition to 410° C. for the amorphous silicon deposition. This resulted in substrate deposition temperatures of 300° C. and 330° C. for the two films respectively.

Silicon Nitride Deposition
  SiH$_4$ 110 sccm
  NH$_3$ 550 sccm
  Nitrogen 3900 sccm
  Power 600 Watts
  Pressure 0.8 Torr
  Spacing 1000 mils
  Susceptor Temperature 358° C.
  Substrate Temperature 300° C.

Amorphous Silicon Deposition
  SiH$_4$ 275 sccm
  H$_2$ 1550 sccm
  Power 300 Watts
  Pressure 1.2 Torr
  Spacing 1000 mils
  Susceptor Temperature 410° C.
  Substrate Temperature 330

The silicon nitride and amorphous silicon films were judged to be of good quality and the electrical characteristics of transistors made with these films were judged to be good.

In the above Example the susceptor temperature was changed while the glass was still in the chamber between the silicon nitride and the amorphous silicon depositions. The rate of change of the susceptor temperature is between 3–5° C./min, so that a large change in temperature requires a lengthy period of time, approximately 15 minutes in this example. For small changes in the susceptor temperature, this procedure may be practical.

The above Example also demonstrates that a reported restriction, that the substrate temperature must be reduced for each subsequent deposition, e.g., the substrate temperature for the amorphous silicon deposition must be lower than for the gate dielectric silicon nitride, or the substrate temperature for an etch stop silicon nitride, must be less than for the preceding amorphous silicon layer, was not a requirement of the present processes. This feature is a significant advantage over prior art processes.

EXAMPLE 4

In this Example three layers were deposited sequentially in the same reaction chamber at the same susceptor temperature; a gate dielectric silicon nitride layer about 500 angstroms thick; an amorphous silicon layer about 500 angstroms thick; and an etch stop silicon nitride layer about 3000 angstroms thick. The deposition conditions are summarized below:

Gate Dielectric Silicon Nitride
  SiH$_4$ 110 sccm
  NH$_3$ 550 sccm
  Nitrogen 3900 sccm
  Power 600 Watts
  Pressure 0.8 Torr
  Spacing 1000 mils
  Susceptor Temperature 337° C.
  Substrate Temperature 282° C.

Amorphous Silicon
  SiH$_4$ 275 sccm
  Hydrogen 1550 sccm
  Power 300 Watts
  Pressure 1.2 Torr
  Spacing 1000 mils
  Susceptor Temperature 337° C.
  Substrate Temperature 280° C.

Etch Stop Silicon Nitride
  SiH$_4$ 330 sccm
  NH$_3$ 1100 sccm

Nitrogen 11,000 sccm
Power 1500 Watts
Pressure 2.0 Torr
Spacing 1500 mils
Susceptor Temperature 337° C.
Substrate Temperature 300° C.

The gate dielectric silicon nitride and amorphous silicon were good quality films. The etch stop silicon nitride is required to have film properties that are different than the gate dielectric silicon nitride, and thus it is not considered a high quality film by the standards discussed hereinabove. In particular, the etch stop silicon nitride has a high wet etch rate and a high concentration of Si—H bonds. The electrical characteristics of the transistors made with these films are good and comparable to transistors made with gate dielectric and amorphous silicon films deposited at higher temperatures than the etch stop silicon nitride.

Thus in this Example we demonstrated that three layers of a transistor can be deposited in the same chamber and with the same susceptor temperature. The processes used herein were successful despite deviating from the restrictions reported by prior art workers, i.e., that sequential layers must be deposited at progressively lower substrate temperatures.

The above-described CVD process can be utilized in systems known for multistep processing of semiconductor substrates, such as is disclosed by Maydan et al in U.S. Pat. No. 4,951,601 or in vacuum systems designed to deposit multiple layers onto large glass substrates for the manufacture of thin film transistors, as described in copending applications of Norman Turner et al entitled "VACUUM PROCESSING APPARATUS HAVING IMPROVED THROUGHPUT", (Ser. No. 08/010,684 filed Jan. 28, 1993) and "METHOD OF HEATING AND COOLING LARGE AREA GLASS PLATES AND APPARATUS THEREFOR" (Ser. No. 08/010,683 filed Jan. 28, 1993) filed concurrently herewith and incorporated herein by reference. This vacuum system is described below with reference to FIG. 2.

FIG. 2 is a plan view of a vacuum system for deposition of multiple films onto large glass substrates.

Referring now to FIG. 2, a deposition system 111 comprises a series of chambers for deposition of a plurality of thin films on large area glass substrates. Cassettes 112A, 112B, 112C and 112D contain a plurality of shelves mounted on an elevator assembly for the storage of large glass substrates thereon. A robot 114 is used to carry the glass substrates one at a time from the cassettes 112 into one of two combination cool and load lock chambers 116A and 116B through a closable opening 117 to atmosphere. The system 111 also includes a heating chamber 118 to bring the glass substrates up to deposition temperatures. A series of four CVD chambers 120, 122, 124 and 126, together with the two cooling/load lock chambers 116 and the heating chamber 118 define between them a transfer chamber 128. The cooling/load lock chambers 116A and 116B and the heating chamber 118 have cassettes mounted on an elevator assembly (not shown) that can be indexed vertically. The cassettes of these heating and cooling chambers 116A, 116B and 118 have conductive shelves therein for supporting the glass substrates while they are being heated or cooled.

After the robot 114 transfers a glass substrate from a cassette 112 into the cassette of a cooling/load lock chamber 116A, the elevator assembly raises (or lowers) the cassette by the height of one shelf, when another glass substrate is transferred to the cooling chamber 116A by the robot 114. When all of the shelves in the cassette of the chamber 116A have been filled, the closable opening 117 is closed and the chamber 116A is evacuated. When the desired pressure is reached, a closable opening 131 adjacent the transfer chamber 128 is opened. A transfer robot (not shown) transfers all of the glass substrates from the cooling/load lock chamber 116A to a cassette in the heating chamber 118, where the glass substrates are heated to near deposition temperatures. The cassette in the heating,chamber 118 and the cooling chamber 116A are raised or lowered after each transfer to present a different shelf to the transfer robot in the transfer chamber 128.

When the glass substrates have reached deposition temperature, the transfer robot transfers the glass substrate to one or more of the CVD chambers 120, 122, 124 or 126 sequentially in a preselected order. For example, the multilayer thin films of the invention may be deposited in a first CVD chamber, and a doped amorphous silicon film deposited in a second CVD chamber, and the like. When all of the preselected depositions have been made, the transfer robot transfers the processed glass substrates back to the cassette of the cooling/load lock chamber 116A. The closable opening 131 is closed when all of the shelves in the cooling/load lock chamber 116A have been filled. Concurrently, the robot 114 is transferring another batch of glass substrates from a different cassette 112C to a cassette in the cooling/load lock chamber 116B and evacuating the chamber 116B when loading is complete.

When all of the processed glass substrates in the cooling/load lock chamber 116A have been cooled to below about 150° C., the chamber 116A is brought to ambient pressure, the closable opening 117 is opened and the robot 114 unloads the now processed and cooled glass substrates back to a cassette 112.

Thus the system 111 is built for continuous operation. The combination of batch heating and cooling of glass substrates, an operation that takes a relatively long period of time, e.g., several minutes, and single substrate CVD processing of thin films, which takes a comparatively short time, maximizes the throughput and efficiency of the system 111.

Although the invention has been described in accordance with certain embodiments and examples, the invention is not meant to be limited thereto. The CVD process herein can be carried out using other CVD chambers, adjusting the gas flow rates, pressure and temperature so as to obtain high quality films at practical deposition rates. Sequential thin films of silicon oxide, gate dielectric silicon nitride, etch stop silicon nitride, and amorphous silicon can be deposited in the same chamber by adjusting various deposition parameters as described above, and in various sequences depending on the transistor design to be made. For example, a silicon oxide layer can be deposited in the chamber of Example 1 using a silane flow rate of 300 sccm, a nitrous oxide flow rate of 6000 sccm, power of 500 Watts, pressure of 2 Torr and a spacing of 1462 mils to give a deposition rate of 924 angstroms/min. Alternatively, one or more of the deposited films can be deposited in another chamber as in FIG. 1. The invention is meant to be limited only by the scope of the appended claims.

We claim:

1. A method of depositing a plurality of different layers in a single chamber under a continuous vacuum and discharge condition, comprising:

providing a processing chamber designed for plasma enhanced chemical vapor deposition, said chamber having a gas manifold plate and a substrate support that function as RF electrodes for generating at least a first and a second plasma in said chamber, said gas manifold plate and said substrate support operating to substantially confine one of said first and second plasma therebetween;

maintaining an operating pressure in a predetermined processing pressure range and chamber temperature so that said substrate support is at a processing temperature in a predetermined processing temperature range without reducing a substrate temperature for each subsequent deposition;

depositing a dielectric layer at a first deposition rate from the first plasma produced from a first precursor gas mixture over a substrate positioned on said substrate support at a first processing temperature in said predetermined processing temperature range and a first pressure in said predetermined processing pressure range;

depositing an amorphous silicon film at a second deposition rate from the second plasma produced from a second precursor gas mixture over said substrate at a second processing temperature in said predetermined processing temperature range and a second pressure in said predetermined processing pressure range, said amorphous silicon film being formed in contact with said dielectric layer;

purging said chamber with a gas at a predetermined purging flow for a predetermined purging duration to substantially eliminate residual gases between said deposition steps to minimize cross-contamination therebetween; and adjusting said gas manifold plate and said substrate support relative to each other to obtain a predetermined spacing therebetween in a relation with said predetermined processing pressure range to optimize said first and said second deposition rates, said predetermined spacing determining an optimum plasma volume to optimize said minimization of said cross-contamination.

2. A method as in claim 1, wherein said predetermined processing pressure range is selected to maximize said first and said second deposition rates and to maintain a stable plasma condition.

3. A method as in claim 2, wherein a lower limit for said predetermined processing pressure range is about 0.5 Torr.

4. A method as in claim 1, wherein depositing amorphous silicon film is performed subsequent to depositing dielectric layer and said amorphous silicon film is formed atop said dielectric layer.

5. A method as in claim 4, wherein said first processing temperature for depositing said dielectric layer is substantially equal to said second processing temperature for depositing said amorphous silicon film.

6. A method as in claim 4, wherein said first processing temperature for depositing said dielectric layer is lower than said second processing temperature for depositing said amorphous silicon film.

7. A method as in claim 1, wherein depositing amorphous silicon film is performed prior to depositing dielectric layer and said dielectric layer is formed atop said amorphous silicon film.

8. A method as in claim 7, wherein said first processing temperature for depositing said dielectric layer is substantially equal to said second processing temperature for depositing said amorphous silicon film.

9. A method as in claim 7, wherein said first processing temperature for depositing said dielectric layer is higher than said second processing temperature for depositing said amorphous silicon film.

10. A method as in claim 1, wherein said predetermined processing temperature range of said substrate support is approximately from 250° C. to 370° C.

11. A method as in claim 1, wherein said predetermined spacing has a relation with a dimension of said substrate.

12. A method as in claim 1, wherein said removing reacting gases is carried out by purging said chamber with a carrier gas between said deposition steps at a predetermined purging flow and a purging duration, both of which have a relation to said predetermined spacing.

13. A method as in claim 12, wherein said predetermined spacing and said optimum plasma volume minimize surface area in said chamber that is in contact with said first and second precursor gas mixtures, resulting in a short purging duration of about 30 seconds.

14. A method as in claim 1, wherein said predetermined spacing and thereby said optimum plasma volume increase a concentration of reactive species confined therein to at least, in part, enhance said first and second deposition rates.

15. A method of making a semiconductor device having amorphous silicon by depositing a plurality of different layers in a single chamber under a continuous vacuum condition, comprising:

providing a processing chamber designed for plasma enhanced chemical vapor deposition, said chamber having a gas manifold plate and a substrate support that function as RF electrodes for generating at least a first and a second plasma in said chamber, said gas manifold plate and said substrate support operating to substantially confine one of said first and second plasma therebetween;

controlling said chamber to maintain an operating pressure in a predetermined processing pressure range and a chamber temperature so that said substrate support is at a processing temperature in a predetermined processing temperature range without reducing a substrate temperature for each subsequent deposition;

depositing a gate dielectric layer at a first deposition rate from a first plasma produced from a first precursor gas mixture over a patterned gate layer on a substrate positioned on said substrate support at a first processing temperature in said predetermined processing temperature range and a first pressure in said predetermined processing pressure range;

purging said chamber with a carrier gas at a predetermined purging flow and a purging duration to substantially eliminate residual gases from said first deposition and thus minimize cross-contamination in a subsequent deposition;

depositing an amorphous silicon film at a second deposition rate from a second plasma produced from a second precursor gas mixture over said gate dielectric layer at a second processing temperature in said predetermined processing temperature range and a second pressure in said predetermined processing pressure range; and adjusting said gas manifold plate and said substrate support relative to each other to obtain a predetermined spacing therebetween in a relation with said predetermined processing pressure range to optimize said first and said second deposition rates, said predetermined spacing determining an optimum plasma volume to optimize said minimization of said cross-contamination.

16. A method as in claim 15, wherein said gate dielectric layer is a silicon nitride layer or a silicon oxide layer.

17. A method as in claim 15, wherein said predetermined processing pressure range is approximately from 0.8 Torr to 2.5 Torr.

18. A method as in claim 15, wherein said predetermined processing temperature range of said substrate support is approximately from 250° C. to 370° C.

19. A method as in claim 18, where said first temperature for depositing said gate dielectric layer is substantially equal to or greater than said second processing temperature for depositing said amorphous silicon film.

20. A method as in claim 15, further comprising:
   forming an etch stop silicon nitride layer over said amorphous silicon film in said chamber under continuous vacuum condition.

21. A method as in claim 15, wherein said substrate is made of glass.

22. A method as in claim 15, further comprising forming a layer of doped amorphous silicon over said amorphous silicon film in a separate chamber.

23. A method as in claim 15, wherein said second precursor gas mixture includes a carrier gas of hydrogen.

24. A method as in claim 16, wherein said first precursor gas mixture for depositing said silicon nitride layer as said gate dielectric layer includes a carrier gas of nitrogen.

* * * * *